(12) United States Patent
Gapontsev et al.

(10) Patent No.: US 10,615,570 B2
(45) Date of Patent: Apr. 7, 2020

(54) HIGH POWER HIGH EFFICIENCY FIBER LASER AND METHOD FOR OPTIMIZING WALL PLUG EFFICIENCY THEREOF

(71) Applicant: IPG PHOTONICS CORPORATION, Oxford, MA (US)

(72) Inventors: Valentin Gapontsev, Worcester, MA (US); Valentin Fomin, Ziegen (DE); Eugene Scherbakov, Burbach (DE); Alex Ovtchinnikov, Worcester, MA (US); Anton Ferin, Burbach (DE); Andrey Abramov, Burbach (DE)

(73) Assignee: IPG PHOTONICS CORPORATION, Oxford, MA (US)

( * ) Notice: Subject to any disclaimer, the term of this patent is extended or adjusted under 35 U.S.C. 154(b) by 0 days.

(21) Appl. No.: 14/558,339

(22) Filed: Dec. 2, 2014

(65) Prior Publication Data

US 2019/0305513 A1    Oct. 3, 2019

Related U.S. Application Data

(60) Provisional application No. 61/910,798, filed on Dec. 2, 2013, provisional application No. 61/911,297, filed on Dec. 3, 2013.

(51) Int. Cl.
*H01S 5/065* (2006.01)
*H01S 3/067* (2006.01)
(Continued)

(52) U.S. Cl.
CPC .............. *H01S 5/065* (2013.01); *H01S 3/067* (2013.01); *H01S 3/0675* (2013.01);
(Continued)

(58) Field of Classification Search
CPC ........ H01S 5/065; H01S 5/4012; H01S 3/067; H01S 3/094069; H01S 3/2308; H01S 3/1603; H01S 3/1618
See application file for complete search history.

(56) References Cited

U.S. PATENT DOCUMENTS

| 6,801,550 B1 | 10/2004 | Snell et al. |
| 2005/0226286 A1 | 10/2005 | Liu et al. |

(Continued)

FOREIGN PATENT DOCUMENTS

| JP | 2012124304 A | 6/2012 |
| JP | 2013505586 A | 2/2013 |
| JP | 2013197371 A | 9/2013 |

*Primary Examiner* — Armando Rodriguez
(74) *Attorney, Agent, or Firm* — Yuri B. Kateshov, Esq.; Timothy J. King, Esq.

(57) ABSTRACT

The inventive laser is configured with a plurality of pigtailed multimode (MM) diode lasers each receiving a direct input current at a room temperature which is maintained to be within a 20-25° C. inside the housing of the laser. The diode lasers each are configured to operate at a desired wavelength in an optimal operational range, in which the diode laser operates with a WPE range between 63% and 75%. The direct current inputted in each diode laser is selected to be below a threshold at an efficiency curve of the diode laser after which the efficiency of the diode laser starts decreasing while an output power of the diode laser continues to increase. The laser is further configured with a fiber gain block having an active fiber medium which is pumped with the cumulative pump output and operative to emit a laser output in a power range between hundreds of watts and tens and even hundreds of kilowatts at the desired wavelength in an optimal operation range. The optimal operational ranges of respective MM diode lasers and fiber gain block are (Continued)

matched to achieve a superposition of respective efficiency maximums providing an overall maximum system efficiency up to 55%.

12 Claims, 5 Drawing Sheets

(51) Int. Cl.
*H01S 3/094* (2006.01)
*H01S 3/23* (2006.01)
*H01S 5/40* (2006.01)
*H01S 3/0941* (2006.01)
*H01S 3/16* (2006.01)

(52) U.S. Cl.
CPC ...... *H01S 3/0941* (2013.01); *H01S 3/094069* (2013.01); *H01S 3/2308* (2013.01); *H01S 5/4012* (2013.01); *H01S 3/1618* (2013.01)

(56) References Cited

U.S. PATENT DOCUMENTS

| 2006/0239312 A1* | 10/2006 | Kewitsch | H01S 5/0683 |
| | | | 372/29.023 |
| 2009/0092157 A1 | 4/2009 | Gapontsev | |
| 2009/0296751 A1 | 12/2009 | Kewitsch et al. | |
| 2011/0305250 A1* | 12/2011 | Chann | G02B 27/0905 |
| | | | 372/6 |
| 2012/0263197 A1 | 10/2012 | Koplow | |

* cited by examiner

HIGH POWER HIGH EFFICIENCY FIBER LASER AND METHOD FOR OPTIMIZING WALL PLUG EFFICIENCY THEREOF

BACKGROUND OF THE DISCLOSURE

Field of the Disclosure

The disclosure relates to a high power fiber laser with enhanced wall-plug efficiency ("WPE"), which exceeds 45%, and a method of configuring the high power fiber laser with the enhanced WPE.

Prior Art

High power fiber lasers have become the laser of choice for many industrial applications due to advantages which include high reliability, little maintenance, small footprint and low cost of maintenance compared to conventional laser sources. A fundamental demand of the fiber laser and fiber-coupled laser market is cost reduction. Therefore it is essential, among others, to increase the wall-plug efficiency, i.e., total electrical-to-optical power efficiency of a laser system.

In general, the efficiency of a solid state laser is determined by three key parameters: the pump semiconductor laser diode electrical-optical conversion efficiency, the coupling or transfer efficiency of the pump light into the active medium, and the optical-optical conversion efficiency of the active gain media and the following loss of power in the laser itself. These parameters, of course, can be further broken down into sub-parameters.

The efficiency of the pump semiconductor laser diodes is high, with on the order of 50% electrical-to-optical efficiency. Laboratory results are even better, with 70% or even more of the electrical pump energy being converted into light. When a wavelength of this output is matched carefully to the fiber laser's absorption line, the result is the enhanced wall plug efficiency ("WPE") of the pumped fiber laser.

The optical-to-optical conversion efficiency depends on a small quantum defect, high excitation and extraction efficiency and background loss. It can be on the order of 60% to 90%.

Of course, other components of a fiber laser system, such as the thermal control of the laser components and electronics, auxiliary control electronics for monitoring diodes, the AC-DC power conversion efficiency and others, introduce additional losses. However, their cumulative contribution to the overall inefficiency of the system is relatively insignificant. As well known to one of ordinary skill in the laser arts, except for semiconductor lasers, all known other types of lasers, including fiber lasers manufactured by the assignee and designated YLS-xxx-Y13, operate with a WPE in the 25% to 35% range. The high limit of this range should be raised and raised significantly to meet the demands of the market.

A need therefore exists for a high power fiber laser having the overall WPE higher than that of the known art. Preferably, Yb high power fiber lasers operate in efficiency range between about 45% and 55%.

Returning to particular components of a fiber laser system, every laser component has its own dependence of efficiency from different parameters. For example, the power supply's WPE depends on the output voltage and operating current; WPE of pump laser diode ("PLD") depends on the LD current etc. Particularly inefficient are laser diodes. Until a laser diode starts generating light, the consumed power is simply wasted. The same problem relates to a fiber block, but losses are substantially lower than those of laser diodes. Electronic components, such as monitors, control circuits, drivers and other components contribute to overall losses, but compared to the laser diodes, their contribution is rather insignificant at high output powers.

A further need therefore exists for a high power fiber laser system configured so that individual components operate within respective maximum efficiency ranges which contribute to the overall efficiency of the fiber laser system up to 55% efficiency.

Referring to the main contributor to the overall wall plug inefficiency—PLDs, there are several loss mechanisms at work. One is a so-called Below Threshold which includes a certain amount of the drive current which is consumed simply to attain population inversion in the laser. Further, there are non-radiative mechanisms that consume carriers. The second mechanism includes Band alignment: the laser diode must overcome the voltage deficit resulting from misalignment of the hand structure of various heterostructure interfaces. Until the deficit is overcome, useful optical power cannot be generated. Still another mechanism—Carrier leakage—refers to bi-polar carriers that do not make it to the quantum well to effectively produce photons. A further mechanism known as Scattering and Absorption accounts for generated photons that do not stay in the waveguide due to scattering that occurs within the quantum well, waveguide or imperfect mirrors. Additionally, photons in the waveguide can be absorbed by the free-carriers. And finally, the Joule heating mechanism results from the effective series resistance of the diode, which includes contact resistances as well as bulk resistance in the heterostructure itself. Among all of the listed loss mechanisms, the Below Threshold mechanism is most detrimental to the PLD's WPE.

A further need, therefore, exists for a high power fiber laser system configured with one or more PLDs each if which operates at the current threshold above which the efficiency of LD's operation decreases.

SUMMARY OF THE DISCLOSURE

The above-discussed needs are addressed by the disclosed high power fiber laser and methodology for configuring this system.

The disclosed high power fiber laser system is configured with one or more PLDs emitting multimode light which is coupled into the gain medium. One of the premises underlying any design of high power fiber laser systems, i.e., systems operative to output signal light whose output power may reach tens and hundreds of kW, is quite simple and well understood by one of ordinary skill in the laser arts: increased power of individual laser diodes. Remarkable levels of power have been achieved in the laser diode arts as a result of perpetual pursuit of higher powers. Reaching the maximum available power, as one of ordinary skill in the laser arts readily recognizes, can be accomplished at certain maximum levels of diode current.

The inventive concept of the present disclosure is based on a rather counter-intuitive approach. Instead of operating PLD at its high input current leading to maximum powers, the present invention uses current levels lower than a certain predetermined threshold, i.e., the current level above which the efficiency of PLDs starts decreasing, despite increased output power. The increased WPE of the optimized laser diodes, in combination with other optimally selected parameters of various components of the high power fiber laser system amounts to the overall efficiency of the entire system capable of reaching about 55%. Note that for purposes of this invention, the WPE does not include the power necessary to operate any chiller to provide chilled cooling fluid, such as water, to the laser.

The WPE up to 55% is a pioneering number. The Applicants, each having a multi-year experience in the fiber laser industry and advanced degrees in laser physics, do not know a single available fiber laser, particularly high power Yb fiber laser that has the WPE approaching even 40%.

Furthermore, the use of laser diodes operating at current levels below the threshold considerably increases the diodes' useful lifetime. The reduced power of individual PLDs leads to less detrimental consequences of thermodynamic processes associated with high temperatures which are thus lower than those associated with a typical PLD. As a result, the cost of operating the disclosed fiber laser system considerably reduces.

While the losses introduced by PLDs are the highest, many other components of the disclosed high power fiber laser are configured to operate so as to contribute to the increased WPE.

Based on the above, the inventive laser is configured with a plurality of pigtailed multimode (MM) diode lasers each receiving a direct input current at a room temperature which is maintained to be within a 20-25° C. within the housing of the laser. The diode lasers each are configured to operate at a desired wavelength in an optimal operational range, in which the diode laser operates with a WPE range between 63% and 75%. The direct current inputted in each diode laser is selected to be below a threshold at an efficiency curve of the laser diode after which the efficiency of the diode laser starts decreasing while an output power of the diode laser continues to increase. The laser is further configured with a fiber gain block having an active fiber medium which is pumped with the cumulative pump output and operative to emit a laser output in a power range between hundreds of watts and tens and even hundreds of kilowatts at the desired wavelength in an optimal operation range. The active fiber preferably has its opposite ends coupled to respective SM fibers and is configured so that the entire fiber gain block operates in a optimal operational range in which an optical to optical efficiency ranges between 80% and 90%.

The efficiency maximums of respective laser diodes or pump and gain block are so matched that an overall maximum system efficiency ranges up to 55%. All of the following components individually and in combination with others are also configured to contribute to the overall maximum 55% WPE. In regard to Yb high power fiber lasers, the overall WPE lies in a 45-55% range.

For example, the driver unit including a plurality of digital components is configured to operate in an optimal efficiency range at least 98%. The power supply block energizing the driver unit and including a plurality of electronic digital components which are configured to provide an operation of the power supply block in an optimal efficiency range with an efficiency maximum of about 95% which, when superpositioned with the respective maximum efficiencies of the diode lasers, power block and driver, provides the maximum system efficiency.

Accordingly, these and other features, objectives and advantages will be discussed in detail herein below in the specific description.

BRIEF DESCRIPTION OF THE DRAWINGS

The specific description will become more readily understood based on the accompanying drawings, in which.

SPECIFIC DESCRIPTION

The following part of the present disclosure relates to Yb fiber laser. However, one of ordinary skill readily realizes that the inventive concept is fully applicable to any fiber gain medium including all relevant rare earth elements. As one of ordinary skill worker in the laser arts readily realizes, the WPE of any laser depends on the rare earth element selected. One of ordinary skill clearly understands that erbium (Er) and thulium (Tm) will understand that WPE will be somewhat lower than that of Yb fiber laser due to inherent physical characteristics of Er and Tm. However, while the following discussion is based on the Yb oscillator (laser), fiber amplifiers are inherently included within the scope of this disclosure and the methodology disclosed herein below applies to lasers and amplifiers based on other than Yb rare earth ions.

The components of a fiber laser each may operate with the optimal efficiency which is a function of multiple parameters. The inventive concept relates to the increased efficiency of the entire fiber system configured with at least one of the system's components so that a selected parameter or parameters characterizing the operation of this component vary within a certain range that provides the component's maximum WPE.

Figure 1:
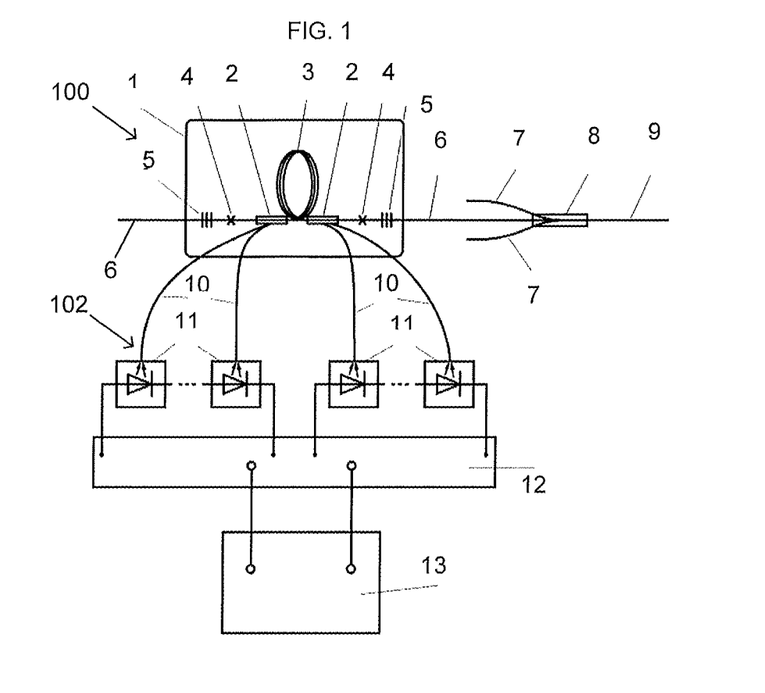
FIGS. 1 and 1A are diagrammatic optical schemes of the disclosed high power fiber laser system and a MOPA configuration, respectively.

Referring to FIG. 1, an exemplary high power fiber laser system 100 is configured with a plurality of components. A gain block is configured with a housing 1 enclosing a gain medium, such as an optical fiber 3 which is doped with any suitable rare-earth element or a combination of these elements. For example, active fiber 3 may have a double-clad configuration and be doped with ions of Yb—the element of choice for many industrial fiber laser applications, as known to one of ordinary skill in the laser arts. Typically, active fiber 3 is configured with the multimode core capable of supporting propagation of substantially only a fundamental mode at a given wavelength. But of course, the active fiber may have a single mode core. Accordingly, regardless of the configuration of the core, the output of the inventive laser is emitted in a single mode.

Coupled to opposite ends of active fiber 3 are respective single mode input and output passive fibers 6 which are spliced to the respective ends of active fiber along splice regions 4. Strong input and weak output fiber Bragg gratings 5 are written in respective passive fibers 6 and defined therebetween is a resonant cavity including the entire length of active fiber 3. As depicted, laser system 100 is configured with a single gain block housing an oscillator, but as easily recognized by one of ordinary skill, system 100 may include several fiber gain blocks coupled together with each configured as an amplifier. The only structural difference distinguishing the amplifier from the oscillator includes the absence of the gratings. Furthermore, several gain blocks each configured identically to the shown block may have respective output fibers 7 coupled together in a SM-MM combiner 8, disclosed, for example, in U.S. Pat. No. 7,953,435 with a single delivery fiber 9 that delivers the signal light to the desired destination.

A pump 102 configured in accordance with U.S. Pat. No. 7,773,655 and others includes multiple individual PLDs 11 emitting pump light in multiple modes ("MM"). The pump light from PLDs is coupled into respective MM pump light delivery fibers 10 that are coupled to gain medium 3 by means of pump couplers 2. As shown, pump light is coupled into gain medium 3 in opposite directions, but only one of co- or counter-propagating coupling directions may be used. A supply block 13 outputs the current coupled in a driver 12, as known to one of ordinary skill in the art.

The high power fiber laser system 10 as disclosed above has rather a typical configuration. The novelty of this system includes configuring one or more of the disclosed components so that the selected components operate with respective maximum WPEs which allows system 100 to have the entire system WPE up to 55%.

The efficiency of every laser component reaches its maximum within a particular range of its parameters. These optimal operation ranges of different laser components are matched to achieve superposition of efficiency maximums leading to maximum system efficiency. Each of the laser's components combined with the pump and fiber gain block can only enhance the 45-55% efficiency range in Yb high power laser. Similarly, all of the component or any combination of the components along with the gain block and pump yields the inventive efficiency range.

Figure 2:
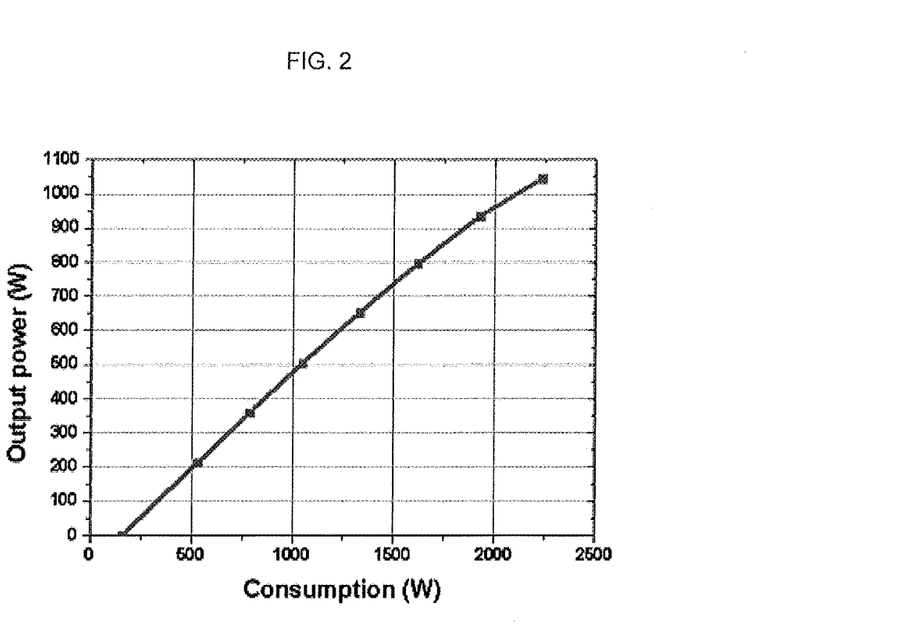
FIG. 2 is a graph illustrating the overall efficiency of fiber laser system of FIG. 1.

FIG. 2 illustrates a typical dependence of the output power of system 100, which is operative to emit about a 1 kW SM output, from the total power consumption, i.e., cumulative consumption of system components. This dependence has a threshold roughly about 200 W. It means that initial 200 W are wasted and typically converted to the undesirable heat which necessitates powerful cooling systems that, in turn, contribute to the overall system's inefficiency. If the threshold can be shifted towards zero, the overall WPE, i.e., the ratio Pout/Pin would be gradually becoming more and more uniform. In other words, the overall efficiency of the system would be independent from the output power. However, in reality, it is next to improbable to configure a perfectly efficient laser system. For example, a certain amount of the drive current must be consumed simply to attain population inversion in the laser diode. Similar mechanism is at work in any gain medium. Accordingly, the goal of the disclosed system is to operate at as low a threshold as the nature allows. This is attained by optimizing the efficiency of at least one, but preferably all system components.

Figure 3:
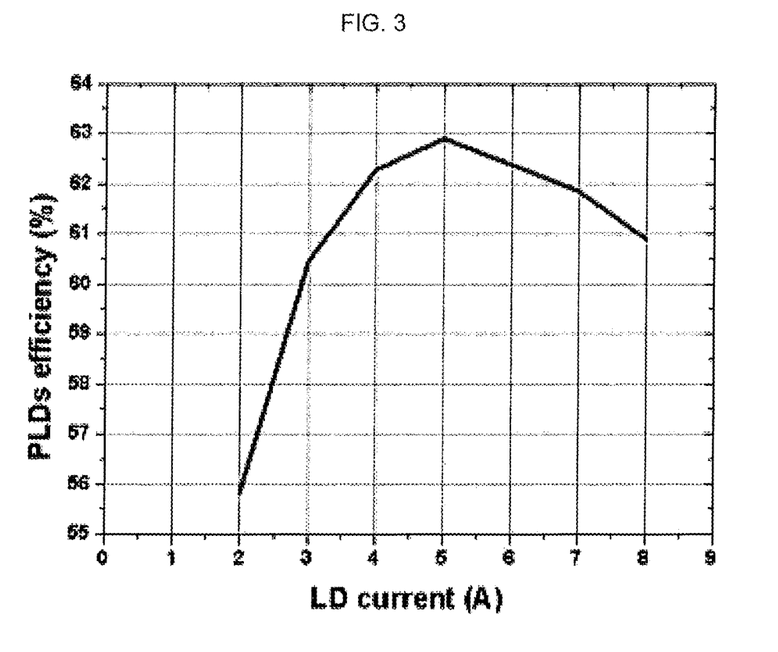
FIG. 3 is a graph illustrating typical dependence of the PLDs' efficiency vs. LD current.

FIG. 3, considered here in combination with FIG. 1, illustrates a typical dependence of WPE of PLD 11 from its drive current ("LD") at a given voltage. In general, LD's WPE=Useful Optical Output Power÷(Input Current×Voltage Dropped across Device). The operation of PLDs is one of the most damaging factors contributing to the overall inefficiency of system 100 of FIG. 1. To minimize the significance of this factor, it is imperative that laser diodes each operate within the optimal current range. The graph of FIG. 3 clearly shows that the maximal WPE of PLD 11 corresponds to the LD range around 5 A. However, typically, laser diodes that are used in high power fiber laser systems of the type shown in FIG. 1 operate in a 9 to 13 A range so as to increase the wattage of pump light. As a consequence, operating PLD 11 at progressively high levels above 5 A gradually decreases the diode's WPE at a given voltage.

Taking into consideration the maximum WPE of PLD 11, pump 102 of Yb fiber laser system 100 is configured with PLDs 11 each operating within a 4 to 6 A range of drive current which corresponds to as high the diode's WPE as about 63%. Preferably, PLD 11 lases pump light at the drive current closer to 5 A. By comparison, the highest known efficiency of laser diodes is below 60%, and on a rare occasion, it may reach about 70% but only in the laboratory. The disclosed system 100 with pump 102 is configured to operate in the field conditions and ready for mass production. Note that PLDs 11 are the same laser diodes as those used in kW fiber laser systems including system 100. Each optimized PLD 11 is capable of operating within its typical high amperage range and more particularly 13 A as is typical for 1 kW Yb fiber laser. But such a high current simply does not make any sense from the efficiency standpoint.

Figure 4:
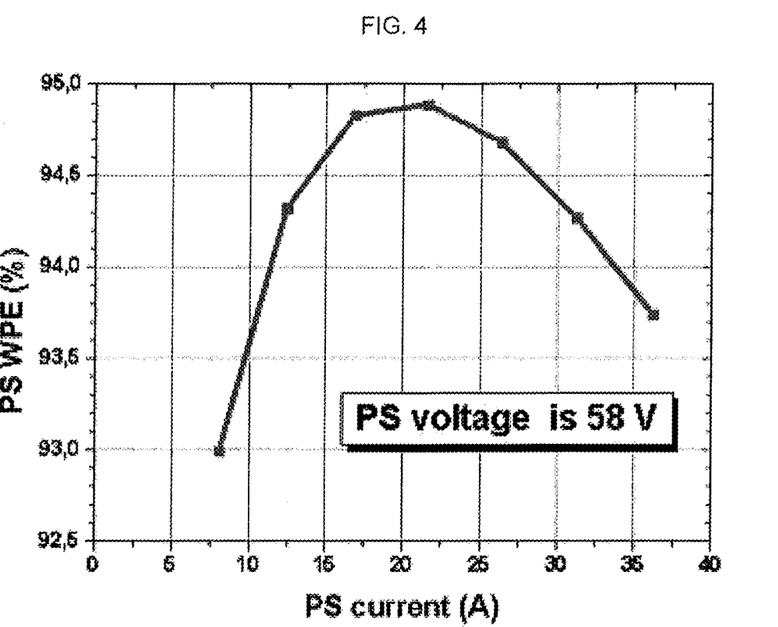
FIG. 4 is a graph illustrating typical dependence of the power supply's WPE vs. output current for particular output voltage.

Referring to FIGS. 1 and 4, the WPE of power supply 13 depends on the output voltage and operating current. FIG. 4 illustrates a typical dependence of power supply's WPE from the output current for a particular output voltage. For power supply 13, the shown optimal current range is 15-25 A.

Figure 5:
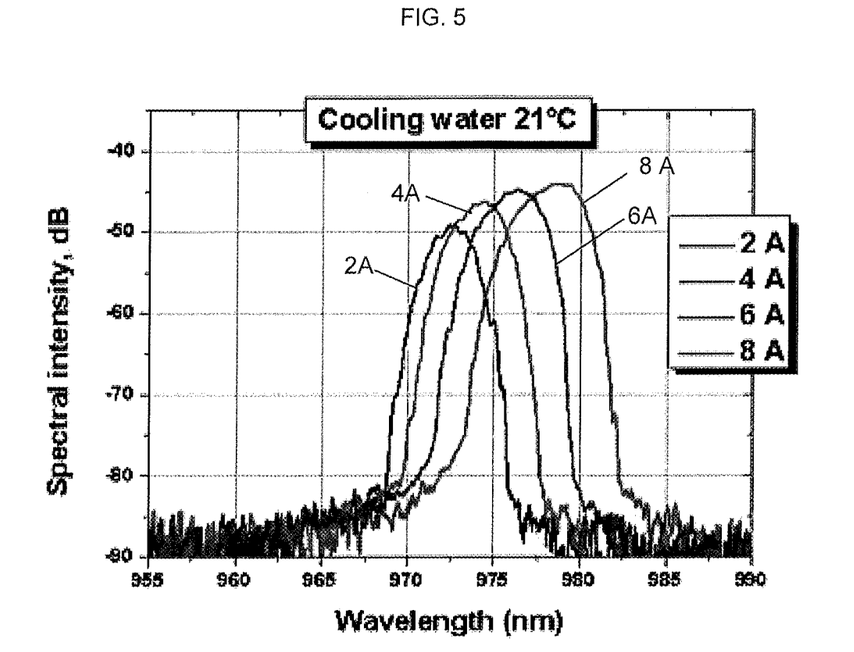
FIG. 5 illustrates a graph of PLDs cumulative spectrum vs. LD current at a given cooling water temperature.
Figure 6:
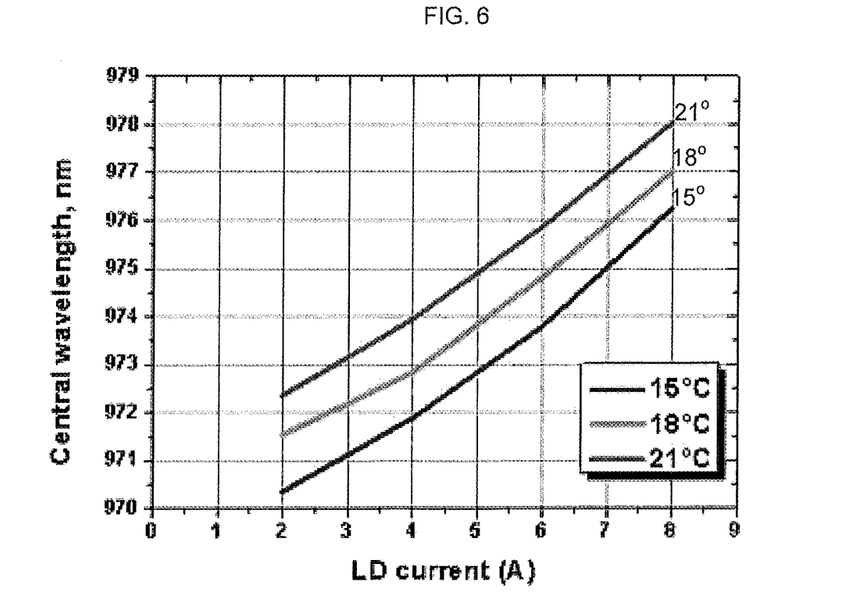
FIG. 6 illustrates dependence of a central wavelength of PLDs' cumulative spectrum vs. LD current at a given cooling water temperature.
Figure 7:
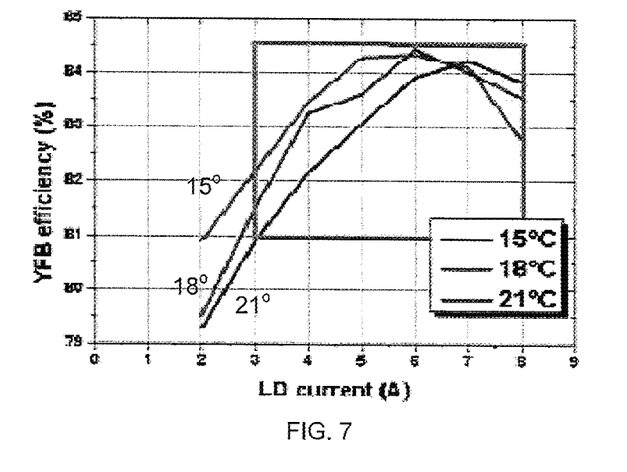
FIG. 7 illustrates dependence of Ytterbium ("Yb") fiber block's efficiency vs. LD current.
Figure 8:
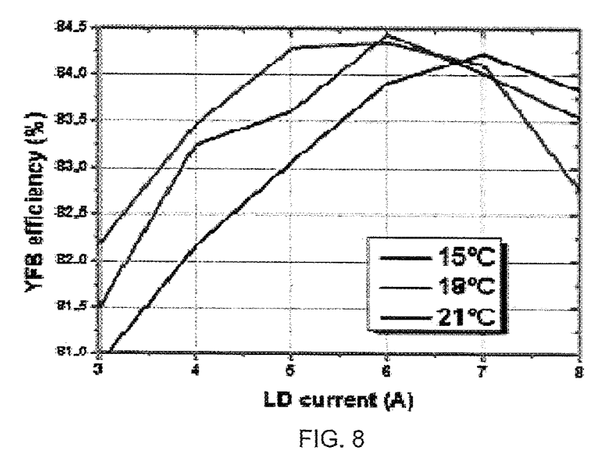
FIG. 8 is an enlarged view of the boxed portion of FIG. 7.
Figure 9:
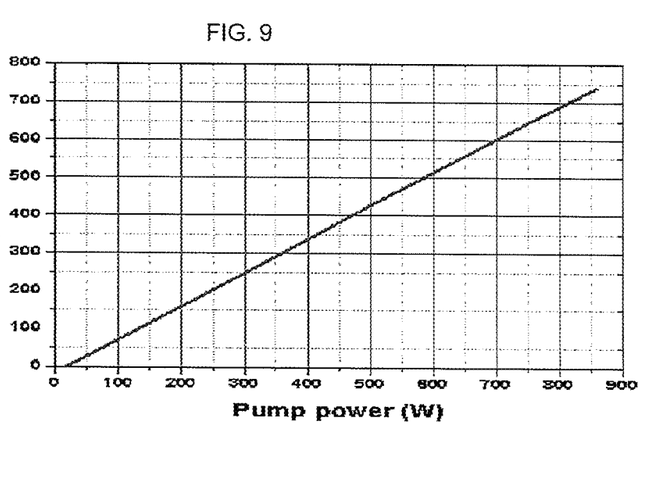
FIG. 9 illustrates typical dependence of output power of Yb fiber block vs. pump power.

Referring to FIGS. 1 and 5-6, the pump conversion efficiency of Yb fiber 3 depends on the pump absorption ratio which strictly depends on the wavelength of the pump radiation. The maximal pump absorption in ytterbium doped active fibers corresponds to the PLDs wavelength 975 nm. The wavelength of PLDs radiation depends, in turn, on the LD current and cooling conditions. In particular, the wavelength spectrum shifts to longer wavelengths as LD currents and high cooling water temperatures increase (FIGS. 5 and 6).

Referring FIGS. 1, 3-9, knowing a variety of individual optimized efficiency values of respective components of system 100, the optimal values should be matched to achieve the optimal efficiency of system 100. For example, maximum of PLDs' efficiency shown in FIG. 3 should correspond to the 975 nm wavelength of PLDs 11. Such a configuration ensures emission around 975 nm at LD current 5-6 A under normal cooling conditions and allows the maximum value of pump conversion efficiency at LD current 5-6 A by the Yb fiber block including pump couples and splices between fibers 6 and 3. The conversion efficiency of the Yb fiber block ranges from about 83% to about 87% and even 90% (FIG. 9) at the optimal 5 A operating current of PLDs 11 and respective temperatures 15°, 18° and 21° C. The optimal temperature range within the housing of the laser is determined to be at a room temperature ranging between 20 and 25° C.

In addition to the optimization of the above-discussed components, other system components can be optimized as well. For the overall efficiency of system 100 exceeding 45%, the following individual optimal efficiency values of respective system components have been determined and listed below, as follows:

A. Pump laser diodes (PLDs) 11 should have wall-plug efficiency >62% at LD current 6 A and proper cooling conditions.

B. Driving electronics 12 of PLDs should guarantee losses <2% over the entire LD current range.

C. Maximal efficiency of power supplies (PS) 13 should be >94%.

D. Ytterbium fiber block (YFB) should have pump conversion efficiency >87%. This requirement is met by the following configurations:

d1. Preliminary selection of active fibers 3. Active fiber should have low pump losses, low signal losses and high pump absorption.

d2. Fundamental mode of the active fiber 3 should be matched with fundamental mode of the passive fibers 6 to guarantee low splice losses.

d3. Fiber Bragg gratings (FBGs) 5 should be written on the respective passive fiber 6. FBGs should have low intrinsic losses.

d4. Pump couplers 2 should have losses <2%.

E. If required, single-mode radiation of multiple YFBs could be launched into the output multi-mode fiber 9 by means of the combining element 8. In this case the combining element should have losses <1.5%.

All of the above allows achieving a maximal value of YFB's pump conversion efficiency over 87%.

Even more specific, the driver unit outputting direct current is configured to operate in an optimal efficiency range with a 98% efficiency maximum and in any case the driver unit is configured to operate with losses lower than 2% over the maximally efficient range of the diode laser.

Figure 1A:
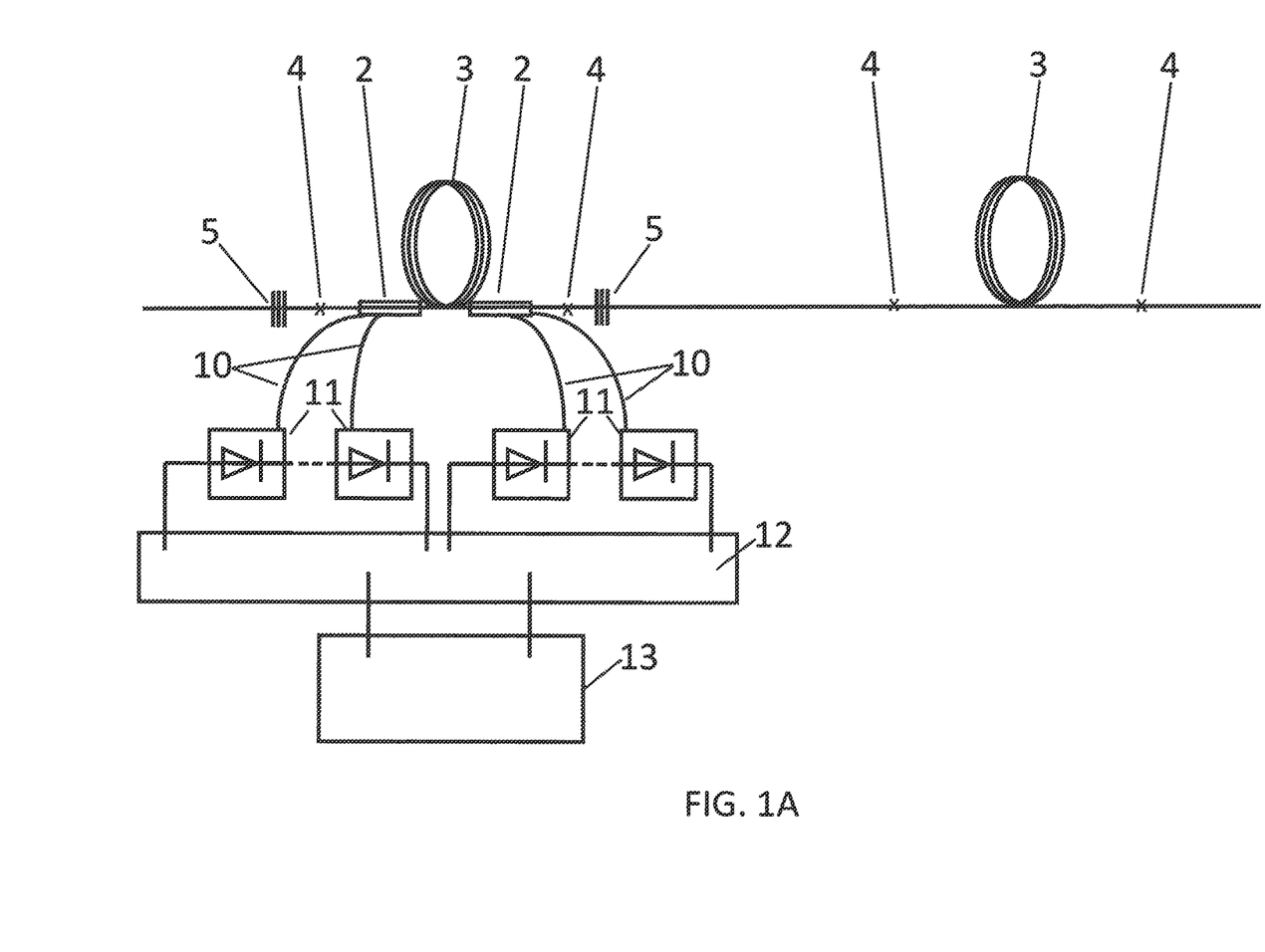

The power supply block energizing the driver unit and including a plurality of digital components which are configured to provide an operation of the power supply block with an efficiency maximum of about 95%. The delivery fiber directly coupled to an output of the fiber gain block and guiding the laser output to a destination point, is configured to have losses less than 0.1% at the desired wavelength. If a plurality of SM fiber lasers configured in accordance with the invention and coupled in parallel have respective SM outputs combined in the SM-MM combiner which is configured to have losses less than 0.1% at the desired wavelength. Each laser may be configured to include two gain blocks defining thus a MOPA configuration, as shown in FIG. 1A.

Among numerous advantages of the disclosed structure, fiber lasers with WPE >45%, the following advantages are particularly important:

Lower power consumption, lower operation costs.

Ecological issues. Reduced energy consumption allows to decrease emission of carbon dioxide and other greenhouse gases.

Lower thermal load. The cooling system could be simpler and cheaper in this case.

Laser design is more robust and reliable that guarantees longer operational life.

With the disclosed structure, the laser diodes operating in the disclosed efficiency range generate a pump output substantially matching a pump output that would be produced by the same number of the laser diodes which operate at the maximum amperage well beyond the optimal point at the efficiency curve. A typical range for the maximum amperage varies between 12 and 13 A for a high power ytterbium fiber laser, whereas the efficient range may vary between 4 and 6 A for the same laser.

Having described at least one of the preferred embodiments of the present invention with reference to the accompanying drawings, it is to be understood that the invention is not limited to those precise embodiments. As disclosed, other rare earth elements may be used for doping fibers. Various changes, modifications, and adaptations including different wavelengths, fiber parameters and rare-earth dopants may be effected therein by one skilled in the art without departing from the scope or spirit of the invention as disclosed above. All of the applications and patents referred to above each are incorporated herein in its entirety and is considered to be an integral part of this application.

The invention claimed is:

1. A high wall plug efficiency (WPE) fiber laser, comprising:

a plurality of pigtailed multimode (MM) diode lasers each receiving a direct input current at a room temperature and operative to emit respective outputs which are coupled together in a cumulative pump output, the diode lasers each being configured to operate at a pumping wavelength in an optimal operational range, in which the diode laser operates with a WPE range between 63% and 75%, wherein an efficiency curve that characterizes the laser diode has a maximum WPE value after which the efficiency of the diode laser starts decreasing while an output power of the diode laser continues to increase, the received direct input current is below a direct input current at the maximum WPE value of the efficiency curve; and a fiber gain block having a gain medium pumped with the cumulative pump output and operative to emit a laser output in a power range between hundreds of watts and tens of kilowatts at a desired wavelength in an optimal operation range in which an optical to optical efficiency ranges between 80% and 90%, wherein a cumulative contribution of the optimal operational ranges of respective MM diode lasers and fiber gain block achieve a superposition of respective efficiency maximums providing an overall maximum system efficiency up to 55%.

2. The high WPE fibre laser of claim 1, wherein the gain medium is doped with ytterbium (Yb) ions, the maximum system efficiency of the fibre laser with the Yb gain block ranging between 45% and 55%.

3. The high WPE fiber laser of claim 1, wherein the laser diodes each operate in the 63%-75% efficiency range at the room temperature range varying between 20 and 25° C.

4. The high WPE fiber laser of claim 1 further comprising a driver unit including a plurality of digital components which are connected to one another to output the current signal coupled into inputs of respective diode lasers, the driver unit being configured to operate in an optimal efficiency range with a 98% efficiency maximum which is superpositioned with the respective maximum efficiencies of the diode lasers and fiber gain block to provide the maximum system efficiency at the desired wavelength.

5. The high WPE fiber laser of claim 4 further comprising a power supply block energizing the driver unit and including a plurality of digital components which are configured to provide an operation of the power supply block in an optimal efficiency range with an efficiency maximum of about 95% which, when superpositioned with the respective maximum efficiencies of the diode lasers, power block and driver, provides the maximum system efficiency.

6. The high WPE fiber laser of claim 1, wherein the fiber gain block is configured with an active fiber doped with ions of rare earth elements, the active fiber having a core selected from a single mode core or multimode core, wherein the core is configured to emit the laser output in a single mode.

7. The high WPE fiber laser of claim 6 further comprising a delivery fiber directly coupled to an output of the fiber gain block, and guiding the laser output in the SM to a destination point, the delivery fiber being configured to have losses less than 0.1% at the desired wavelength to provide the maximum system efficiency.

8. The high WPE fiber laser of claim 6 further comprising a plurality of high WPE fiber lasers coupled in parallel to one another, each WPE fiber laser configured with the plurality of pigtailed MM diode lasers and the fiber gain block.

9. The high WPE fiber laser of claim 8 further comprising a delivery fiber, and a SM-MM fiber combiner which is coupled between the fiber gain block of respective WPE fiber lasers of the plurality of high WPE fiber lasers and the delivery fiber guiding the laser output to a destination point, wherein the SM-MM fiber combiner is configured to have less than a 2% loss and the delivery fiber is configured to have losses less than 0.1% at the desired wavelength to provide the maximum system efficiency.

10. The high WPE laser of claim 1 further comprising an additional fiber gain block coupled in series with an input of the fiber gain block in a master oscillator/power amplifier configuration (MOPA).

11. A method for optimizing wall plug efficiency ("WPE") of a fiber laser, comprising:

generating a direct input current for a diode laser, the direct input current determined from an efficiency curve that characterizes the diode laser and has a maximum WPE value after which the efficiency of the diode laser starts decreasing while an output power of the diode laser continues to increase, the received direct input current is below a direct input current at the maximum WPE value of the efficiency curve;

coupling the direct current into each of pigtailed multi-mode (MM) diode lasers at a room temperature, thereby operating each diode laser at a pumping wavelength and in a WPE range between 63% and 75%;

coupling together outputs of respective MM diode lasers in a cumulative pump output;

inputting the cumulative pump output into a gain medium of a fiber gain block, thereby emitting a laser output in a power range between hundreds of watts and tens of kilowatts at a desired wavelength in an optimal operational range in which an optical to optical efficiency of the fiber gain block ranges between 80% and 90%, wherein a cumulative contribution of the optimal operational ranges of respective MM diode lasers and fiber gain block achieve a superposition of respective efficiency maximums providing an overall maximum system efficiency of up to 55%.

12. The method of claim 11, wherein the gain medium is ions of ytterbium (Yb), the WPE of the fiber laser with the Yb gain block ranging between 45 and 55%.

* * * * *